United States Patent

[11] 3,613,031

[72] Inventor Charles W. Pond
Costa Mesa, Calif.

[21] Appl. No. 884,929
[22] Filed Dec. 15, 1969
[45] Patented Oct. 12, 1971
[73] Assignee Hughes Aircraft Company
Culver City, Calif.

[54] CRYSTAL LADDER NETWORK HAVING IMPROVED PASSBAND ATTENUATION CHARACTERISTIC
4 Claims, 4 Drawing Figs.

[52] U.S. Cl. .......... 333/72, 331/76, 333/6
[51] Int. Cl. .......... H04j 1/02, H03h 9/32
[50] Field of Search .......... 333/70, 72; 331/76, 116; 317/101; 330/117

[56] References Cited

UNITED STATES PATENTS

| | | | |
|---|---|---|---|
| 1,795,204 | 3/1931 | Espenschied | 333/72 |
| 2,165,509 | 7/1939 | Ring et al. | 333/72 |
| 2,248,776 | 7/1941 | Och | 333/72 |
| 2,547,133 | 4/1951 | Lovell | 333/72 |
| 3,426,300 | 2/1969 | Ho | 333/72 |
| 3,416,036 | 12/1968 | Ho | 317/101 |
| 3,374,448 | 3/1968 | Hurtig | 333/72 |
| 3,054,968 | 9/1962 | Harrison | 331/76 |
| 3,456,214 | 7/1969 | Bies | 333/72 |
| 2,045,991 | 6/1936 | Mason | 333/72 |

*Primary Examiner*—Herman Karl Saalbach
*Assistant Examiner*—C. Baraff
*Attorneys*—James K. Haskell and Paul M. Coble

ABSTRACT: The disclosed contiguous crystal filter comb includes a plurality of crystal ladder networks connected to receive a common input signal and having respective frequency passbands covering substantially contiguous predetermined frequency ranges. Each ladder network includes a first capacitor and first and second crystal resonators connected in series between an input terminal and an output terminal. A second capacitor is connected between a reference terminal and a terminal intermediate the crystal resonators. The two crystal resonators in each network provide essentially the same equivalent series capacitance, essentially the same equivalent series inductance, and essentially the same equivalent parallel capacitance. The first capacitor provides a capacitance of at least five times the equivalent parallel capacitance and compensates for inherent slight differences in equivalent circuit values due to nonideal resonators.

INVENTOR.
CHARLES W. POND,
BY
Paul M. Coble
ATTORNEY

CRYSTAL LADDER NETWORK HAVING IMPROVED PASSBAND ATTENUATION CHARACTERISTIC

This invention relates to crystal filters, and more particularly relates to a crystal ladder network especially suitable for use in a contiguous comb arrangement and which provides a more uniform and symmetrical attenuation vs. frequency characteristic over the network passband.

In certain instances it is necessary to sample a varying frequency input signal and to determine in what relatively narrow portion of the input signal frequency excursion range the input signal resides at a given instant in time. For this purpose it has been the practice to feed such an input signal into an array of a large number of crystal filters in which the respective crystal filters have relatively narrow, sharply defined, and substantially contiguous frequency passbands throughout the input signal frequency excursion range. Such an array of crystal filters is often termed a "contiguous comb."

In the past each individual crystal filter in such a comb has usually been constructed in the form of a symmetrical lattice network. Since such networks require at least one inductance coil at either the input or the output of the network, considerable space and weight is consumed in spite of the small size of the crystals themselves. Moreover, these inductors undergo considerably greater changes as a function of both temperature and time than the remaining components of the filter network.

Since inductors are not required in crystal filters of a ladder configuration, it would be desirable to be able to use ladder network filters in contiguous comb and similar arrangements. However, the attenuation vs. frequency characteristics of prior art crystal ladder networks have been sufficiently nonuniform and asymmetrical with respect to the network center frequency as to be impractical for typical contiguous comb applications.

Accordingly, it is an object of the present invention to provide a crystal ladder network having an improved attenuation vs. frequency characteristic over the network passband.

It is a further object of the invention to provide a crystal filter network which is smaller, lighter, less expensive and which has greater stability as a function of both temperature and time than prior art crystal filters with a comparable frequency response.

It is a still further object of the present invention to provide a crystal ladder network which is especially suitable for use in a contiguous crystal filter comb.

It is still another object of the invention to provide a contiguous crystal filter comb which, for a comparable number of similar characteristic filter channels, is smaller, lighter and more reliable in operation than contiguous comb arrangements of the prior art.

A crystal ladder network according to the invention includes a first capacitor and first and second crystal resonators coupled in series between first and second terminals, a second capacitor being coupled between a third terminal and a terminal intermediate the crystal resonators. An input signal is applied to the network between the first and third terminals, while a load resistance is provided between the network second and third terminals.

A contiguous crystal filter comb may be provided by designing a plurality of the aforementioned crystal ladder networks so that the various networks provide respective frequency passbands covering substantially contiguous predetermined frequency ranges, and by applying a common input signal between the first and third terminals of each network. The two crystal resonators in each network have a series resonant frequency in the vicinity of the lower extremity of the network passband and at which an attenuation level a predetermined amount above the minimum attenuation level of the network is provided, and have a parallel resonant frequency higher than the network center frequency by an amount equal to at least twice the network bandwidth.

Additional objects, advantages and characteristic features of the invention will become readily apparent from the following detailed description of preferred embodiment of the invention when considered in conjunction with the accompanying drawings in which.

Figure 1:
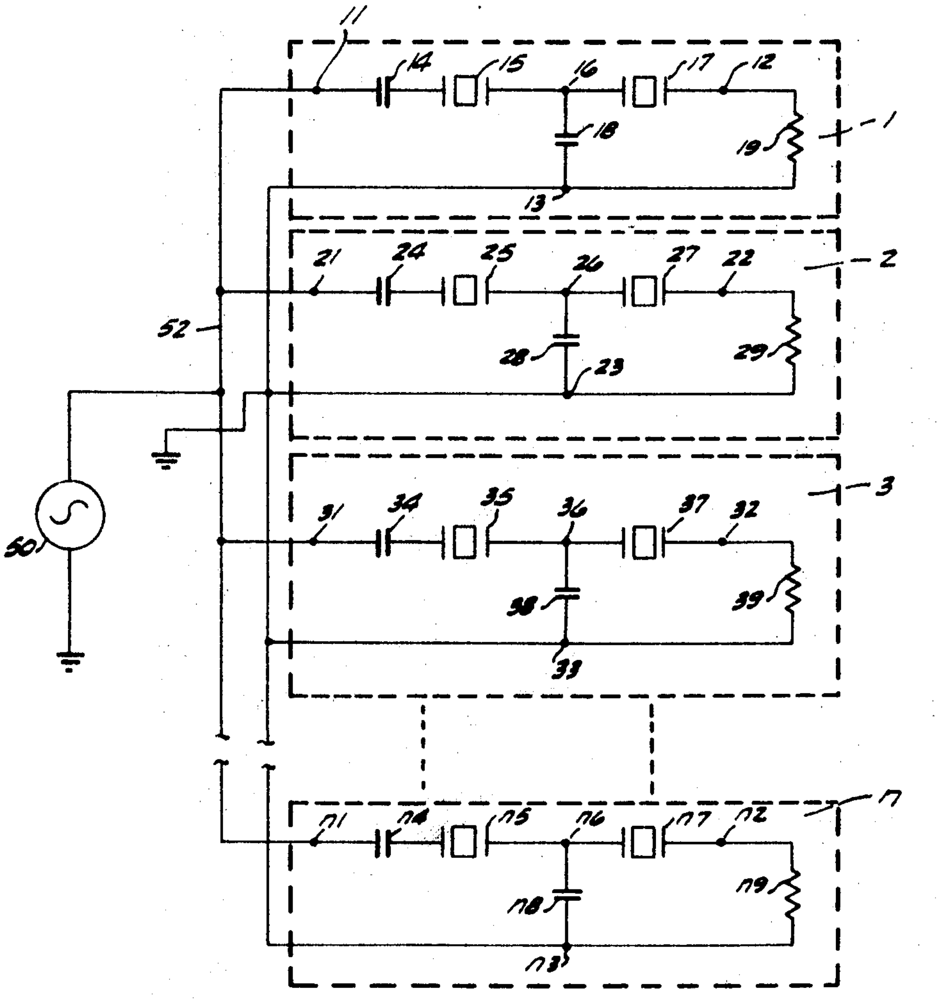
FIG. 1 is a schematic circuit diagram illustrating a contiguous crystal filter comb employing a plurality of crystal ladder networks according to the present invention.

Referring to FIG. 1 with greater particularity, a contiguous crystal filter comb according to the present invention may be seen to include a plurality of crystal filter ladder networks, respectively designated as 1, 2, 3 . . . *n*. It should be understood, of course, that the number of filter networks shown is purely illustrative and in practice would be determined by particular system requirements, usually being on the order of 100 or more. Each of the filter networks 1, 2, 3 . . . *n* provides heavy attenuation for signals at all frequencies except for those falling within the sharply defined frequency passband of the network, with the respective frequency passbands of the various networks covering relatively narrow substantially contiguous predetermined frequency ranges throughout a much wider overall frequency range.

The contiguous crystal filter comb consisting of the respective networks 1, 2, 3 . . . *n* is driven from an input signal source 50 which furnished an AC voltage capable of varying in frequency over the overall frequency response range of the filter comb. The source 50 should have as small a series internal impedance as possible, theoretically approaching zero ohms. One terminal of the voltage source 50 is connected to a first signal lead 52, while the other terminal of the source 50 is connected to a level of reference potential designated as ground in FIG. 1.

Each of the crystal filter ladder networks 1, 2, 3 . . . *n* is of the same configuration, except that the resonant frequencies of the resonators in the respective networks are made slightly different in the manner to be described more fully below so that the various networks have the aforementioned different frequency passbands. Therefore, the configuration and design of the crystal ladder network 1 will be described in detail, it being understood that the other networks 2, 3 . . . *n* may be arranged and designed in the same manner.

The crystal ladder network 1 has an input terminal 11 connected to the signal lead 52, an output terminal 12, and a reference terminal 13 which may be connected to ground. A first capacitor 14 (which may be variable) and a first crystal resonator 15 are connected in series between input terminal 11 possible, an auxiliary terminal 16, a second crystal resonator 17 being connected between auxiliary terminal 16 and output terminal 12. The resonators 15 and 17 should be as similar as possible and preferably provide essentially the same equivalent series (motional) capacitance, essentially the same equivalent series (motional) inductance, and essentially the same equivalent parallel (static) capacitance. A second capacitor 18 is connected between auxiliary terminal 15 and reference terminal 13, while a load resistor 19 is connected between output terminal 12 and the terminal 13.

The remaining ladder networks 2, 3 . . . *n* contain the same components as the network 1, with corresponding components in the networks 2, 3 . . . *n* bearing the same second reference numeral digit as their counterpart elements in the network 1 and the first reference numeral digit indicating the particular network in which the component is located.

Figure 2:
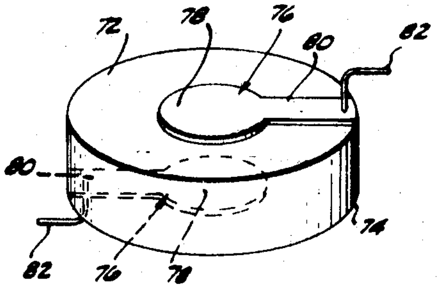
FIG. 2 is a perspective view of an exemplary individual crystal resonator which may be used in a ladder network according to the invention.

An exemplary crystal which may be used to form each of the resonators 15, 17 . . . *n*5, *n*7 in the comb of FIG. 1 is illustrated in FIG. 2 as an AT cut quartz crystal. It should be understood, however, that other crystal cuts, for example, but not being limited to BT, CT, DT, X and SL cuts, may be used instead. As is shown in FIG. 2, the crystal has a pair of opposing broad faces 72 and 74 of circular geometry, with an electrode coating 76 being disposed on each of the crystal faces 72 and 74. Each coating 76, which may be of a metal such as silver, is of a keyhole geometry having a substantially circular portion 78 covering the central region of the broad crystal face on which it is disposed and an elongated rectangular portion 80 extending from the perimeter of the circular portion 78 to the edge of the crystal. The central coating portions 78 on the opposite crystal faces 72 and 74 are aligned with one another, while the rectangular coating portions extend radially outwardly from the respective circular portions 78 in diametrically opposite directions. Electrical leads 82 are soldered or otherwise attached to the respective rectangular coating portions 80 near the edge of the crystal. Each crystal is mounted in a hermetically sealed container (not shown).

Figure 3:
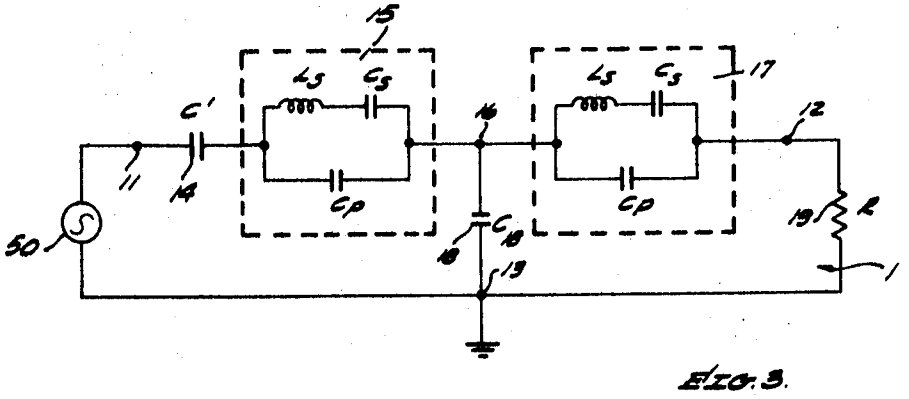
FIG. 3 is an equivalent circuit diagram for a typical crystal ladder network in the comb of FIG. 1.

An equivalent circuit diagram representative of the behavior of the crystal ladder network 1 in the comb of FIG. 1 is given in FIG. 3, components in FIG. 3 being identified by the same reference numerals as in FIG. 1. The circuit behavior of each of the resonators 15 and 17 is represented in FIG. 3 by an equivalent series (motional) inductance $L_s$, an equivalent series (motional) capacitance $C_s$ and an equivalent parallel static capacitance $C_p$. As was mentioned above, it is desirable that the resonators 15 and 17 be as similar as possible to one another and, therefore, have essentially the same inductance and capacitance values $L_s$, $C_s$ and $C_p$. Moreover, in the equivalent circuit of FIG. 3 capacitor 14 provides a capacitance $C'$, capacitor 18 a capacitance $C_{18}$, and load resistor 19 a resistance R.

The series resonant frequency $f_s$ of each of the resonators 15 and 17 is given by $$f_s=\frac{1}{2\pi\sqrt{L_sC_s}} \qquad (1)$$

where $L_s$ and $C_s$ are the resonator equivalent series inductance and capacitance, respectively. The relationship between the series resonant frequency $f_s$ and the center frequency $f_o$ and bandwidth BW of the passband provided by the network 1 is given by $$f_o=f_s+\frac{BW}{2\sqrt{C_1L_2}} \qquad (2)$$

In equation 2, $C_1$ and $L_2$ are the parallel capacitance and series inductance, respectively, in a low-pass prototype network having a cutoff frequency normalized to 1 radian, a load impedance normalized to the 1 ohm, and driven by a constant current source. Specific values for $C_1$ and $L_2$ may be found in the tables of low-pass element values on pages 312–332 of *Handbook of Filter Synthesis* by Anatol I. Zverev, John Wiley and Sons, 1967.

The appropriate value for load resistance $R$ in the equivalent circuit of FIG. 3 may be determined by $$R=\frac{BW}{2\pi f_o^2L_2C_s} \qquad (3)$$

Similarly, the appropriate value for capacitance $C_{18}$ may be $$C_{18}=\frac{f_oC_s\sqrt{C_1L_2}}{BW} \qquad (4)$$

Capacitor 14 is employed to compensate for inherent slight differences in equivalent circuit vales for the resonators 15 and 17, because in practice it is not possible to achieve identical crystal resonators. Capacitor 14 should provide a capacitance $C'$ at least five times the resonator equivalent parallel capacitance, i.e., $C' \geq 5C_p$.

Figure 4:
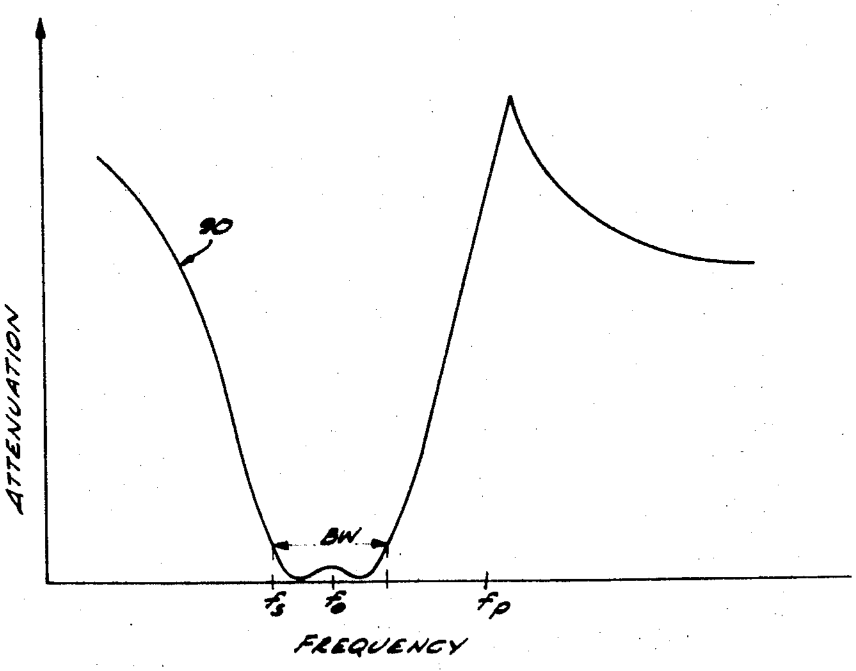
FIG. 4 is a graph depicting the attenuation vs. frequency characteristic for the ladder network represented in FIG. 3.

The attenuation vs. frequency characteristic 90 for the crystal ladder network 1 is shown in FIG. 4, it being understood that the remaining ladder networks 2, 3 . . . *n* have similarly shaped characteristics but surrounding successively higher center frequencies $f_o$. The resonators 15 and 17 are made to have a series resonant frequency $f_s$ (determined from equation 1) at a frequency in the vicinity of the lower extremity of the frequency passband (designated by bandwidth BW in FIG. 4) of the network 1 and a which frequency $f_s$ the attenuation provided by the network 1 is a o amount (for example 2.5 db.) above its minimum level. The resonators 15 and 17 are also preferably made to have a parallel resonant frequency $f_p$ higher than the network center frequency $f_o$ by at least twice the network bandwidth $BW$, i.e., $f_p \geq f_o+2BW$.

In designing a crystal ladder network in accordance with the principles of the invention, desired values for the network center frequency $f_o$ and bandwidth BW are first selected, and the proper series resonant frequency $f_s$ is computed from equation 2 using selected values for $C_1$ and $L_2$. The product of the resonator equivalent series inductance $L_s$ and capacitance $C_s$ can then be computed from equation 1, and crystal resonator design specifications (for parameters such as the type of crystal thickness, electrode area, etc.) can be determined to provide the desired inductance-capacitance product. Appropriate values for resistance R and capacitance $C_{18}$ may then be calculated using equations 3 and 4. The ladder network may then be constructed using a variable capacitor for capacitor 14, since the optimum value for capacitance $C'$ depends upon the degree to which the actually constructed resonators 15 and 17 are nonideal. The capacitance $C'$ may then be varied until the attenuation, represented by curve 90 of FIG. 4 is as constant as possible over the network bandwidth BW, and any slight variations in attenuation over the bandwidth BW are as symmetrical as possible about the center frequency $f_o$. After the optimum capacitance value $C'$ has been determined, a fixed capacitor 14 may be substituted for the variable capacitor, if desired.

It is further pointed out that although the crystal ladder network 1 is especially suitable for use in a contiguous filter comb of the type shown in FIG. 1, such a ladder network can be used by itself as an individual crystal filter or it may be employed in a variety of other crystal filter combinations.

Thus, although the invention has been shown and described with reference to particular illustrative embodiments, nevertheless, various changes and modifications which are obvious to a person skilled in the art to which the invention pertains are deemed to lie within the purview of the invention.

What is claimed is:

1. A contiguous crystal filter comb comprising: a plurality of crystal filter channels having respective frequency passbands covering substantially contiguous predetermined frequency ranges, each channel including a first terminal, a second terminal, a third terminal, a first capacitor and first and second crystal resonators coupled in series between said first and second terminals, a second capacitor coupled between said third and a terminal intermediate said first and second crystal resonators, means for providing a load resistance between said second and third terminals, said first and second crystal resonators in each channel having a series resonant frequency in the vicinity of the lower extremity of the associated channel passband and at which an attenuation level a predetermined amount above the minimum attenuation level of the channel is provided, and having a parallel resonant frequency higher than the channel center frequency by an amount equal to at least twice the channel bandwidth; and means for applying a common input signal between said first and third terminals of each channel.

2. A contiguous crystal filter comb comprising: a plurality of crystal filter channels having respective frequency passbands covering substantially contiguous predetermined frequency ranges, each channel including a first terminal, a second terminal, a third terminal, a fourth terminal, a first capacitor and a first crystal resonator coupled in series between said first and fourth terminals, a second crystal resonator coupled between said second and fourth terminals, a second capacitor coupled between said third and fourth terminals, said first and second crystal resonators in each channel having a series resonant frequency in the vicinity of the lower extremity of the associated channel passband and at which an attenuation level a predetermined amount above the minimum attenuation level of the channel is provided, and having a parallel resonant frequency higher than the channel center frequency by an amount equal to at least twice the channel bandwidth; and means for applying a common input signal between said first and third terminals of each channel.

3. A contiguous crystal filter comb according to claim 2 wherein in each channel said first and second crystal resonators provide essentially the same equivalent series capacitance, essentially the same equivalent series inductance, and essentially the same equivalent parallel capacitance.

4. A contiguous crystal filter comb according to claim 3 wherein in each channel said first capacitor provides a capacitance of at least above five times said equivalent parallel capacitance.

PO-1050
(5/69)

UNITED STATES PATENT OFFICE
CERTIFICATE OF CORRECTION

Patent No. 3,613,031 Dated October 12, 1971

Inventor(s) Charlés W. Pond

It is certified that error appears in the above-identified patent and that said Letters Patent are hereby corrected as shown below:

Col. 2, line 31, "furnished" should be --furnishes--;
Col. 2, line 61, "15" should be --16--.
Col. 3, line 24, "static" should be --(static)--;
Col. 3, line 48, delete "the";
Col. 3, line 64, "vales" should be --values--.
Col. 4, line 2, "a" should be --at--;
Col. 4, line 3, "o" should be --predetermined--;
Col. 4, line 16, after "of" insert --crystal,--.
Col. 6, line 6, "above" should be --about--.

Signed and sealed this 9th day of May 1972.

(SEAL)
Attest:

EDWARD M.FLETCHER,JR.
Attesting Officer

ROBERT GOTTSCHALK
Commissioner of Patents